US009750105B2

(12) United States Patent
Rantala (10) Patent No.: US 9,750,105 B2
(45) Date of Patent: Aug. 29, 2017

(54) LED STRUCTURE WITH QUASI-CONTINUOUS SPECTRUM AND METHOD OF ILLUMINATION

(71) Applicant: Juha Rantala, Bäch (CH)

(72) Inventor: Juha Rantala, Bäch (CH)

( * ) Notice: Subject to any disclaimer, the term of this patent is extended or adjusted under 35 U.S.C. 154(b) by 0 days.

(21) Appl. No.: 14/710,629

(22) Filed: May 13, 2015

(65) Prior Publication Data

US 2016/0338169 A1 Nov. 17, 2016

(51) Int. Cl.
H05B 37/02 (2006.01)
H05B 33/08 (2006.01)
H01L 25/075 (2006.01)
H01L 33/50 (2010.01)

(52) U.S. Cl.
CPC ..... *H05B 33/0857* (2013.01); *H01L 25/0753* (2013.01); *H05B 33/0818* (2013.01); *H01L 33/504* (2013.01)

(58) Field of Classification Search
CPC . H01L 25/0753; H01L 33/486; H01L 33/505; H01L 33/58; H01L 33/62; H01L 33/0818; H05B 33/0857
IPC .................................................. H01L 25/0753
See application file for complete search history.

(56) References Cited

U.S. PATENT DOCUMENTS

| 5,012,609 A | 5/1991 | Ignatius et al. |
| 5,278,432 A | 1/1994 | Ignatius et al. |
| 5,801,793 A * | 9/1998 | Faris ................. G02B 27/0093 348/E13.004 |
| 7,350,933 B2 | 4/2008 | Ng et al. |
| 8,302,346 B2 | 11/2012 | Hunt et al. |
| 8,410,725 B2 | 4/2013 | Jacobs et al. |
| 8,549,787 B2 | 10/2013 | Aikala |

(Continued)

FOREIGN PATENT DOCUMENTS

| CN | 201797809 U | 4/2011 |
| CN | 103947469 A | 7/2014 |

(Continued)

OTHER PUBLICATIONS

Argyroudi-Akoyunoglou et al: Photoinduced Changes in the Chlorophyll a to Chlorophyll b Ratio in Young Bean Plants. Plant Physiology. 247-9, 1970.

(Continued)

*Primary Examiner* — Tung X Le
*Assistant Examiner* — Raymond R Chai
(74) *Attorney, Agent, or Firm* — Seppo Laine Oy (57) ABSTRACT

A LED structure and a method of providing pulsed light energy synchronized with the photosynthesis process by an integrated LED structure. The LED structure comprises a substrate; a plurality of optically independent light emission areas on substrate; a light emitting semiconductor source of a first type mounted in part of the emission area(s); a light emitting semiconductor source of a second type mounted in part of the emission area(s); and wavelength conversion materials of at least two types. The first type is formed on the top of the said first type of light emitting semiconductor sources and the second type is formed on the top of the said second type of light emitting semiconductor sources.

The LED structure suits grow light systems that require dynamic luminaires with adjustable spectrum, tunable intensity and controllable pulse mode operation.

1 Claim, 6 Drawing Sheets

(56) References Cited

U.S. PATENT DOCUMENTS

| | | | | |
|---|---|---|---|---|
| 2006/0261742 | A1* | 11/2006 | Ng | H05B 33/0818 |
| | | | | 315/86 |
| 2013/0139437 | A1* | 6/2013 | Maxik | H05B 37/02 |
| | | | | 47/58.1 LS |
| 2014/0034991 | A1* | 2/2014 | McKenzie | F21K 9/00 |
| | | | | 257/98 |
| 2014/0152194 | A1 | 6/2014 | Beyer | |
| 2015/0078010 | A1* | 3/2015 | Kundaliya | F21V 9/08 |
| | | | | 362/317 |

FOREIGN PATENT DOCUMENTS

| | | |
|---|---|---|
| CN | 103947470 A | 7/2014 |
| WO | WO02067660 A1 | 9/2002 |
| WO | WO2013141824 A1 | 9/2013 |
| WO | WO2014188303 A1 | 11/2014 |

OTHER PUBLICATIONS

Beelman & Kalaras: Post-harvest Vitamin D Enrichment of Fresh Mushrooms HAL Project#MU07018 (Apr. 30, 2009), Penn State University.
Carvalho et al: Sequential light programs shape kale (*Brassica napits*) sprout appearance and alter metabolic and nutrient content. Horticulture Research (2014) 1, 8.
Eytan et al: Changes in photosystem i activity and membrane organization during degreening and greening of a chlamydomon as reinhardi mutant, y-1. J. Biol. Chem. p. 738-744. 1974.
Golheck: Photosystem I. Bioenergetics volume of Biophysics 2004.
Klueter et al: Photosynthesis in Cucumbers with Pulsed or Continuous Light. Transactions of the ASABE. 23 (2): 0437-0442. 1980.
Lefsrud et al: irradiance from distinct wavelength light-emitting diodes affect secondary metabolites in kale. HortScience 43:2243-2244, 2008.
Nicklish A: Growth and light absorption of some planktonic cyanobacteria, diatoms and chlorophyceae under simulated natural light fluctuations. J. Plankton Res. 20:105-119.
Olle et al: The effects of loght-emitting diode lighting on greenhouse plant growt and quality. Agricultural and Food Science, 22:223-234, 2013.
Sforza et al: Adjusted Light and Dark Cycles Can Optimize Photosynthetic Efficiency in Algae Growing in Photobioreactors. PLoS One 7(6): e38975, 2012.
Tennessen et al: Efficiency of photosynthesis in continuous and pulsed light emitting diode irradiation. Photosynthesis Research 44: 26 1-269, 1995.
Vänninen et al: Prospecting the use of artificial lighting for integrated pest management. ISHS Acta Horticulturae 1, 593-608, 2010.
Yeh, et al: High-brightness LEDs—Energy efficient lighting sources and their potential in indoor plant cultivation. Renewable and Sustainable Energy Reviews 13: 2175-2180, 2009.

* cited by examiner

LED STRUCTURE WITH QUASI-CONTINUOUS SPECTRUM AND METHOD OF ILLUMINATION

FIELD OF INVENTION

The present invention relates to artificial lighting systems and methods used for biomass growing. In particular, the present invention concerns an integrated light emitting diode (LED) structure with adjustable quasi-continuous spectrum characteristics relating to field of optoelectronics and photobiology. The disclosed method of pulsed illumination is useful in the fields of agriculture, horticulture and biomass growing industry in general.

BACKGROUND ART

The greenhouse industry is experiencing an era of rapidly advancing technologies for artificial illumination. LED based luminaires have entered commercial use as grow lights relatively recently. HPS and conventional arc light sources are now moving aside and more efficient LED luminaires are emerging into markets including advanced functionalities e.g. integrated pest management (Vänninen et al., 2012).

However, the potential modes of LEDs for illuminating plants are still rarely fully optimized. Currently used LED based luminaires still suffer low efficiency and provide emission spectra not well overlapping with the absorption spectra of photo biological processes such as photosynthesis. Over-exposing of plants with high intensity sources and lack of advanced control modes such as pulsed illumination are still topics not fully researched or solved in practice. A LED spectrum can be matched with photo biological requirements to enhance plants' growth and to increase the total organic output i.e. the harvested volume of a greenhouse products e.g. tomato or lettuce. Photo biological requirements are mainly defined by the absorption spectrum of the photosynthesis and other photo biological processes in question. There is also a need to meet the timing requirements of the illumination when operating with a pulsed light. The timing requirement arises from the chlorophyll B excitation and electron transfer delay to the chlorophyll A associated process and the potential to optimize the energy usage for driving the photosynthesis. Other natural parameters that account for the illumination requirements include e.g. partial pressure of carbon dioxide, irrigation level of soil, temperature and type of canopy. Other requirements that constitute to the required illumination spectrum may arise e.g. from marketing motives to grow vegetables with certain skin colors or the need to enhance the product's nutrition content or other effective substance.

Different plants and biomass applications require slightly differing type of illumination conditions to reach optimal growth. This induces greenhouse industry to invest on many types of artificial grow lights. It is the objective of the disclosed invention to provide an integrated LED structure with adjustable emission characteristics to meet the different requirements of various biomass growing applications. The integrated structure, with densely packed emission areas, produces high spectral uniformity in the far field.

A good example is e.g. the growth of red and black soybeans. CN103947470A and CN103947469A disclose light spectrum conditions preferred for optimum growth of red and black soya beans, with rough blue, red, and yellow spectrum band ratios being 3:1:5 and 4:3:3 respectively, demonstrating the need for adjustable spectrum type light source to enable one artificial grow light to be used with a variety of different plants. Similarly for example tomato plant and spruce require quite different type of light to grow efficiently. The required spectrum components also vary between different growing cycles of a same plant e.g. during vegetation phase blue rich light is preferred, and flowering and fruit grow phases are typically connected with red rich light. Another requirement for adjusting the spectrum of the grow light is the need to grow e.g. vegetables with varying skin colors of e.g. bell paprika for marketing purposes or for enhancing certain nutrition components in the paprika fruit.

A grow light with adjustable spectrum would also allow new functionalities not yet fully exploited in the greenhouse industry. For example it is known that a pre-harvesting treatment of kale affects strongly on the nutrition content (Carvalho et al., 2014; Lefsrud et al., 2008). Another example is the UV flash-treatment of cultivated mushrooms prior harvesting or post harvesting to enrich their vitamin D content (Beelman et al., 2009).

Another example of potential benefits of a source with an adjustable emission spectrum becomes apparent from Nicklish, 1998, when considering biomass growth applications such as algae. The absorption spectrum shifts from around 680 nm peak towards lower wavelength peak around 630 nm when the photoperiod becomes shorter. Similar shift in absorbance is documented in the art (Eytan, 1974). The ratio of chlorophyll A and chlorophyll B concentration has been shown to change in time when plant is subjected to continuous illumination as e.g. in case of Red Kidney bean plants (Argyroudi-Akoyunoglou, 1970). Such change presupposes an alteration in the emission spectrum to maintain optimum growth conditions.

It is clear that the grow light should allow flexible modification of spectrum characteristics to enable its use for growing different types of plants and even modifying spectrum characteristics during the different growth phases. These requirements combined with the idea of growing biomass with a pulsed light source are now tackled with the disclosed invention.

Two main approaches exist to build a LED source for luminaires used as grow lights.

In the first approach, the emission spectrum can be generated by combining optical output of different color discreet LEDs. This type of hybridized LED structure is often called an RGB LED. In this approach the LEDs are discreet LED components and e.g. blue-red emissions have clearly distinct spatial source points. The light is produced within the compound semiconductor pn-junction while the emission spectrum from a single pn-junction is relatively narrow, typically only 10 to 40 nm. Due to narrow emission spectrum several semiconductor chips are used in combination to provide the required wider spectrum to fully cover the red and blue wavelength bands of the visible spectrum required by e.g. photosynthesis. Required semiconductor chips can be packaged discreetly or mounted inside a same package however optically forming still a large source point.

In the second approach the emission spectrum is generated within a single LED package. In this case one or several LED semiconductor chips excite wavelength conversion material or typically a phosphor material layer to generate continuous emission spectrum matching closely with the photo biological requirements. For example 440 nm LEDs chip excite an appropriately selected phosphor material layer and can provide typical double peak spectrum offering a relatively good match with the above explained requirements with the primary photo biological process of photosynthesis.

In short, commercial light sources, being LED, fluorescent or HPS, all still commonly apply continuous light with fixed optical spectrum. It is known that it would be beneficial to apply pulsed light to firstly save energy and secondly to apply light source that would enable spectrum adjustment to meet changing spectral requirements during the plant growth cycles, or phase of photosynthesis, or to allow use of same luminaire supporting varying light requirements. Pulsed light arrangement has been shown to benefit also algae growth (Sforza et al., 2012).

PPF (photosynthetic photon flux) should be kept at level similar or equal to sun light level that is roughly 2000 $\mu mols/m^2/s$ to avoid excess light and stressing plants. Now this applies for continuous light. With pulsed light the situation changes as the dark cycle can be adjusted so that the photo biological process has time to 'use' the light energy absorbed during the light cycle. Thus the maximum light intensity can be increased substantially from nominal sun light level of 2000 $\mu mols/m^2/s$ e.g. to 10000 $\mu mols/m^2/s$ to allow even faster growth. However, such arrangements presumes considering the excess heat from the light source, other growth limiting parameters such as the level of carbon dioxide, and also how to avoid self-shadowing from the canopy to best utilize high intensity source.

Artificial grow lights have been under research (Olle et al., 2013; Klueter et al., 1980; Yeh et al., 2009) and development for decades and also pulsed light sources have been introduced earlier, such as JPS6420034A. This source was based on discharge lamps and was able to produce pulse lengths between 1 to 50 ms. Drawbacks of this early innovation was that discharge lamps did not meet well the required spectrum characteristics as large part of the light energy is emitted at wavelengths not needed by photo biological processes. And the pulse lengths were not short enough to fully exploit the benefits of pulsed light.

A study reported by Tennessen with co-workers (Tennessen et al., 1995) shows the benefits of pulsed light. In this study the pulse period of 100 $\mu s$ and dark periods of few ms were used. The experimental light source was assembled from discreet LED components emitting at narrow fixed wavelength bands of 658/668 nm only.

First pulsed grow light based on LEDs appears in U.S. Pat. No. 5,012,609. This approach was based on discreet emitters for each required wavelength band i.e. 400-500, 620-680, and 700-760 nm. The driving circuit was able to produce pulses in duration of 100 $\mu s$, i.e. at optimum length. However, the driving circuit was based on current-limiting-resistor and is considered to have a modest energy efficiency when compared to modern solutions such as the one disclosed in the disclosed invention. Main drawback of the approach was that it did not provide means to adjust the spectrum for different growth cycles. The spectrum was fixed as the discreet visible range wavelength emitters were all required to be in the same serial-parallel circuit.

U.S. Pat. No. 5,278,432 presents some innovations on the packaging and mounting of discreet LEDs on heat sinking substrate. However, driver circuit is still in the form of current-limiting-resistor and the spectrum is fixed with all emitters coupled in series-parallel fashion, excluding the possibility to somehow control the intensity at certain wavelength bands or to adjust the emission spectrum.

WO02067660 (A1) discloses a system level arrangement of red and white light LEDs to optimize the emitted spectrum to speed-up the plant growth. In the disclosed structure the spectrum is fixed after the discreet LEDs have been mounted on the carrier substrate. It is clear from this and later publications discussed below that the pulsed light is preferred mode of operation to reduce the total growth time.

A LED arrangement with an AC driver (cf. U.S. Pat. No. 8,410,725) provides means to reduce total cost of the system by applying same driver circuit for two discreet light sources, emitting in opposite phases of the sinusoidal AC current. Obvious issue is the required large spatial separation of the two LED strings to avoid over exposing the plants under lights and to gain the benefits of the pulsed lighting.

U.S. Pat. No. 8,302,346 discloses a growth enhancing system with a feedback based arrangement applying pulsed light source based again on discreet LED chips each emitting a fixed spectrum.

CN201797809 discloses light source arrangement that applies discreet LED emitters to form the required total spectrum including UV, UVB, blue and near IR.

CN103947470A, CN103947469A disclose light spectrum conditions preferred for optimum growth of black and red soya beans, with rough blue, red, and yellow spectrum band ratios being 3:1:5 and 4:3:3 respectively, demonstrating the need for adjustable spectrum type light source to enable wider use for growth of different plants.

US20130139437 discloses hybridized light source arrangement that would allow spectrum tunability and pulsed operation mode to prevent photosynthesis saturation. However, the presented light source structure has a system level approach based on discreet LED components mounted on printed circuit board with different emission wavelengths, and with a fixed ratio of LED emitters at individual wavelength ranges to create required spectrum. The expensive feedback system approach based on absorption and/or fluorescence sensing gives coarse feedback to allow tuning of intensity, and of the light on and off periods i.e. the light patterns. However, as the absorption of other than chlorophyll molecules such as carotenin molecules, play important role in 'plant's' heat sinking capability, and effectively large part of light energy is wasted when absorbance is used as a feedback. In our disclosed invention a system approach has been adopted that is based on preset or programmable pulse patterns.

WO2014188303 discloses means for enhancing plant growth by adjusting the ratio of blue and red lights alone. US2014152194A1 discloses another system to be able to provide necessary spectrum bands for enhancing the growth.

U.S. Pat. No. 8,549,787 provides an LED arrangement with fixed intensity ratios of characteristic peaks at wavelength bands of 400-500 nm (blue), 500-600 nm (green), 600-800 nm (red), and with 500-600 nm band to have lower intensity compared to other two. However, the said arrangement does not allow adjusting the ratio between the intensities of the said blue and red wavelength bands.

US2014034991A1 and U.S. Pat. No. 7,350,933 both disclose similar LED arrangement to each other that enable the tuning of the color coordinates and thus the chromaticity of the light emitted from the LED arrangement. However, these arrangements are not addressing the requirements of biomass growing applications or e.g. pulsed light operation. The emission spectrum is not meeting the photo biological requirements. The operation is defined to be continuous, while not meeting the requirement of having alternating emission spectrum of pulsed type.

WO2013141824A1 discloses a similar LED arrangement that enables the tuning of the spectrum for matching the chlorophyll b and a absorbance. However, the arrangement is not addressing other requirements of biomass growing applications such as the pulsed light operation. The operation is defined to be continuous failing to benefit from alternating emission spectrum.

SUMMARY OF INVENTION

An objective of this invention is to enhance the usage of electrical energy in the biomass growing applications by providing a device and method.

Another objective is to provide a device and method to enable a grow light with excitation synchronized to photosynthesis.

Another objective is to provide a control circuit and a pulsed illumination mode featuring a constant power loading.

Another objective is to enable dynamic usage of a single type luminaire as an artificial grow light for different plants and biomass growing applications without need for multiple application specific luminaires.

To solve above discussed problems it is an object of the present invention to provide a method of illumination provided by an integrated light emitting diode (LED) structure with an adjustable emission spectrum and ability to support pulsed light emission synchronized with the photosynthesis process and to provide a pulse controlling circuit which enables a constant power loading feature.

Provided is therefore a LED structure comprising
a substrate;
a plurality of optically independent light emission areas on substrate;
a light emitting semiconductor source of a first type mounted in part of the emission area(s);
a light emitting semiconductor source of a second type mounted in part of the emission area(s);
a wavelength conversion material of the first type formed on the top of the said first type of light emitting semiconductor sources; and
a wavelength conversion material of the second type formed on the top of the said second type of light emitting semiconductor sources.

Provided is also a method of providing pulsed light energy synchronized with the photosynthesis process by an integrated LED structure, comprising providing the light energy in a sequence of alternating light pulses with two different emission spectra with peak intensities between 620 and 640 nm and between 650 and 670 nm. In the method, the light energy pulse occurring at 620 and 640 nm is allowed to follow with a delay with light energy suppressed before providing the light energy pulse between 650 and 670 nm; and the light energy pulse occurring between 650 and 670 nm is allowed to follow with a delay with light energy suppressed before providing the next light energy pulse between 620 and 640 nm.

More specifically the present invention is characterized by what is stated in the characterizing parts of the independent claims.

The disclosed integrated LED structure can find potential use in grow light systems previously presented e.g. in U.S. Pat. No. 8,373,361. The disclosed integrated LED structure perfectly suits grow light systems that are applying various sensors for $CO_2$, soil humidity, canopy height, or growth phase to control the illumination by the feedback from the plants and require dynamic luminaires with adjustable spectrum, tunable intensity and controllable pulse mode operation.

In general the emission areas can be independently driven via a control interface to turn on, also called later as activation, to provide a light energy pulse of required length.

A turn off time, also called later as a delay time or deactivation time, with no light emitting from the emission area can be independently controlled via the multiple wire control interface.

Furthermore, the independent current control allows deactivation of all or some of the emission areas for longer periods. Also the independent current control allows setting of emission intensities of each emission area to provide the required spectral density, as required by arbitrary biomass growing application.

Appropriate electrical current control sequence via the control interface allows generating emission spectrums which are varying in time. Time-combined quasi-continuous spectrums can be adjusted dynamically to meet varying lighting requirements.

BRIEF DESCRIPTION OF DRAWINGS

A number of non-limiting embodiments are studied in more detail with reference to the accompanying diagrammatic drawings.

In the drawings.

DESCRIPTION OF EMBODIMENTS

The following descriptions are merely non-limiting examples and it will be appreciated by one skilled in the art that specific details of the examples may be changed without departing from the spirit of the invention.

It is the purpose of the disclosed invention to also provide an integrated LED structure that enables flexible usage of one luminaire for a large variety of biomass growing applications.

Figure 1:
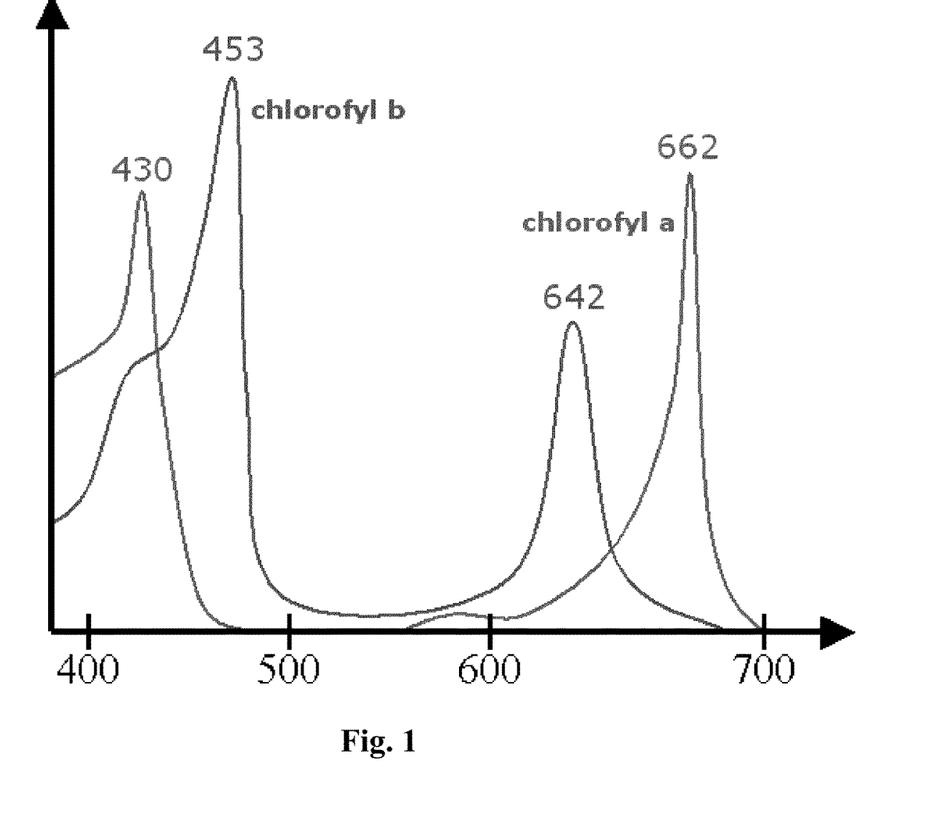
FIG. 1 Is a graph representing relative absorption spectrum of chlorophyll A and chlorophyll B.

A typical mode of use of the disclosed technology is to synchronize the two types of light energy pulses for photo biological process involving both chlorophyll B and chlorophyll A (see FIG. 1). In the double stage photosynthesis process the chlorophyll B and the related PSII and chlorophyll A and the related PSI processes are bound so that the two processes of PSII and PSI follow each other in tandem with a time delay. This delay is defined by the time it takes to complete the non-radiative electron transfer from chlorophyll B to chlorophyll A through the complex chain of electrochemical reactions.

Thus in one embodiment two light energy pulses are applied for excitation also in tandem fashion with matching time delay.

In an embodiment, the light energy pulse of the first type for chlorophyll A excitation follows the light energy pulse of the second type for chlorophyll B excitation with a small delay. During the delay between the two energy pulses the electron transfer process is completed and means that the chlorophyll A becomes available for the lower energy excitation pulse of the first type. If the energy pulse of the first type is given too early the chlorophyll A is not ready to exploit the available energy.

By avoiding the two energy pulses to overlap enhances the total efficiency and reduces the stress experienced by the biological system. However, in the case the first light energy pulse has a low intensity it is possible to allow full or partial overlapping of the second light pulse with the first light pulse. Furthermore, as photo biological process varies largely from one biomass to another biomass growing application also the delay must be tunable. The present technology provides a an embodiment with a LED structure which enables this feature for a luminaire. The said delay varies depending of the application but Golbeck et al. give upper limits of the time scales for specific photosynthesis to be 350 µs to 1 ms for Chlorophyll B related process and 450 µs to 65 ms for Chlorophyll A related process (Golbeck et al., 2004).

Furthermore, the optimum energy levels of the light pulses vary from application to application making it beneficial to have adjustable emission spectrum enabling wider use of a single luminaire for multiple applications. However, there is no general timing recipe but the accurate photo periods and delay periods must be specifically adjusted for each biomass growing application to reach optimum conditions. It must be stated that this type of synchronized dual-wavelength pulsed excitation is an unexpectedly efficient way of providing energy for the photosynthesis in general.

In particular applications it is beneficial to have spectral components in the ultra-violet range. One such application is the growth of cannabis plant for medical purposes. It is known that the tetrahydrocannabinol (THC) content of the plant can be enriched by exposing the plant to ultra-violet light stress around 290 to 325 nm or more generally to UVB light. According to one practical example the disclosed LED structure contains the two red wavelength bands for matched chlorophyll B and chlorophyll A absorption spectra and a separate ultra-violet emitting chip at 315 nm. A multiple wire interface enables independent intensity control of the ultra-violet emitting chip and optionally a pulsed operation. Pulsed operation is preferred to be able to adjust the UV exposure according specific application requirements. Furthermore independent operation is required to enable deactivation of the UV emission for a safe human entry to the growth area.

A practical luminaire structure and lighting arrangement is also challenging as conventional luminaires are relatively large in size, easily serving illumination of biomass growth areas exceeding one square meter. If luminaires operating in continuous mode were converted to a pulsed light source the following issue would arise:

First, one should consider luminaire as a unit with one common power supply driving a set of multiple LED structures, as described above. Pulsed light source alone creates difficulties in power supply side. Large greenhouses typically would require hundreds of luminaires for growth illumination. Each luminaire would easily have nominal power consumption of hundreds of Watts, and even exceeding kilowatt. Each luminaire would thus draw several amperes of current in a continuous operation mode or in average in a pulsed operation mode. Operating luminaires of such high electrical power in a pulsed mode would require a special arrangement of the electrical power supply to prevent the intermittent power loading to cause interference, instabilities on the power grid, or unnecessary stress on the local power grid components. Strict standards apply on the power source electronics to filter the harmonics propagating into the power grid or suppressing them in the first place. Preferably, a set of luminaires should load the power supply or the power grid evenly in time i.e. meaning that the pulse on-time should not be concurring at all luminaires and for example coincidental pulse on-time mode should be avoided. Solving the harmonics issue for the power supply alone is well known technology. However, no solutions have been proposed or found for implementing a pulsed LED light source for the operation in a practical greenhouse environment. This has delayed the introduction and deployment of pulsed luminaires in greenhouse.

Embodiments include a LED component arrangement and circuit for a single luminaire with multiple pulsed integrated LED structures that provide interference free and low-harmonics generation on the power supply side with even loading of power supply.

Embodiments also include source arrangement to provide even loading of power grid with a set of multiple luminaires each applying a plurality of pulsed integrated LED structures.

A constant power loading condition while applying pulsed lighting is an unexpectedly beneficial feature and can be achieved by applying the disclosed switch circuit arrangement.

The constant power loading condition in case of pulsed grow lights is a feature that can be achieved by applying a disclosed switch circuit arrangement. A typical case would be to provide a pulsed emission spectrum to plants. However, in such case the time-off period would naturally cause non-constant power loading as the drive current is turned off. This can be avoided by using a plurality of emission areas of the disclosed integrated LED package. However, as the practical use of pulsed luminaire for the biomass growth necessitates that a certain illuminated area, i.e. a section of a plant, receives the light energy in pulses with appropriately set light-off time. Thus the sub-sets of LED structures must be geometrically arranged in spatially separate sub-sets with a sufficient distance to avoid excessive overlapping of the light fields to avoid losing the benefit of the pulsed mode feeding of the photosynthesis process.

Figure 6:
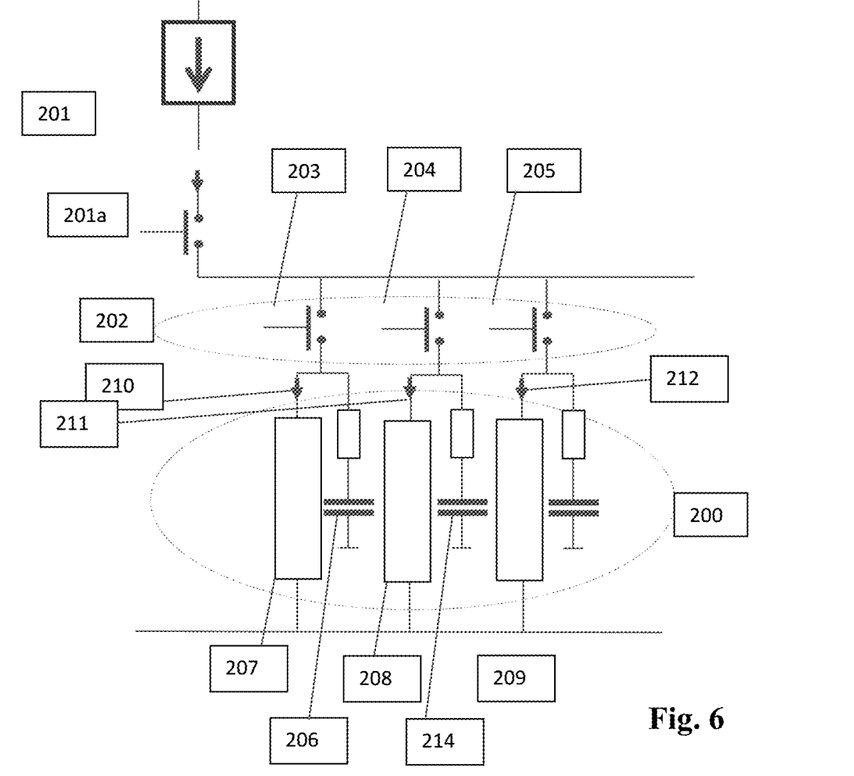
FIG. 6 Is a schematic view of an electronic driving scheme for an integrated LED structure according to an embodiment of the present invention.

The number of spatially separated sub-sets should equal at least to a reciprocal of the duty cycle to allow a constant power loading. Such luminaire arrangement is not necessarily easy to achieve. It is disclosed that the combination of triple wavelength integrated LED structure applying synchronized pulsed excitation can be driven so that the biomass experiences the benefits of pulsed light while maintaining the constant power loading condition. Such arrangement can be formed by a triple switch circuitry driving a LED structure with three emission areas and parallel capacitors as depicted in FIG. 6. The parallel capacitors enable constant draining sourcing during the switching and offer practical timing tolerance for the switching control.

A generic requirement for an operation of the above kind is that the semiconductor emitters must be connected in each emission area for equal current-voltage characteristics. However, such arrangement is not too restrictive and is possible to meet by applying standard semiconductor light emitting diodes available. Even in case of small variation of forward voltages of the diodes the variation in power loading is still negligible. For example a difference of ±5% in forward voltage of two different set of diodes would typically result only a change of ±150 mW, with nominal forward voltage being 3V. With a typical drive current of 350 mA, the variation in power loading would still be only 45 mW. As the pulsed operation for synchronized excitation necessitates relatively short pulses the parallel capacitors must be properly sized to avoid excessive charging and discharging times. Furthermore a resistance in series with the capacitor limits the current peak from the capacitor, though also lengthens the discharging. For example in case of emission areas have single diodes circuits with forward voltages of 3V and taking preferred pulse length 0.1 ms means a 0.1 µF capacitor with 20 ohm series resistor would offer roughly charging and discharging times in less than 2 µs.

The integrated LED structure is also optically small in size to be considered as a point source and enables easy hybridization of conventional optics for appropriate directional control of illumination.

In one embodiment the LED structure comprises at least one light emission area with an optically opaque mesa structure fully bordering or partially bordering the said light emission area. This embodiment will be discussed below in connection with FIGS. 2 and 3.

In one embodiment, the emission areas are vertically in different planes. In such an embodiment, at least two isolated emission areas are located so that one of the emission areas is located in a cavity. At least one of the emission areas has a mesa structure fully bordering or partially bordering the said light emission.

The mesa structure can have wedged or vertical sidewalls.

In one embodiment, at least one of the light emission areas has a polarizing filter on top of the light emission area to polarize the emitted light.

In one embodiment, there is a double layer phosphor structure, in particular a vertical double layer phosphor structure. Thus, in the LED structure at least one of the light emission areas has a dual layer structure formed of two wavelength conversion materials layered upon each other.

In one embodiment of a double layer phosphor structure, the upper wavelength conversion layer has an excitation maximum between 415 and 435 nm and an emission maximum between 620 and 640 nm and full width half maximum about 50 nm.

In one embodiment of a double layer phosphor structure, the lower wavelength conversion layer has an excitation maximum between 430 and 450 and an emission maximum between 650 and 670 nm and full width half maximum about 50 nm.

In one embodiment which can be applied to any of the above embodiments, the light emission area has a set of light emitting components between 415 and 435 nm and between 430 and 450 nm beneath the wavelength conversion material layers.

Typically, the light emitting components are independently controllable.

In one embodiment, the LED structure comprises an electrical control interface for providing the electrical drive current for the light emitting semiconductor sources. The electrical control interface has preferably a number of electrical connection wires equalling the number of light emission areas plus one.

In an embodiment of the present method of providing pulsed light energy synchronized with the photosynthesis process by an integrated LED structure, light energy is provided in a sequence of alternating light pulses with two different emission spectra with peak intensities between 620 and 640 nm and between 650 and 670 nm. The light energy pulse occurring at 620 and 640 nm is typically allowed to follow with a delay with light energy suppressed before providing the light energy pulse between 650 and 670 nm. The light energy pulse occurring between 650 and 670 nm is typically allowed to follow with a delay with light energy suppressed before providing the next light energy pulse between 620 and 640 nm.

In an embodiment, the first light pulse (at 630 nm) has duration of 0.01 ms to 10 ms and preferably is 100 µs.

In an embodiment, the second light pulse (at 660 nm), which follows the first light pulse, has duration of 0.01 ms to 10 ms and preferably is 100 µs.

In an embodiment, the time-off period after the first light pulse is between 0 ms to 10 ms, and preferably 1 ms.

In an embodiment, the time-off period after the second light pulse is between 0.3 ms to 100 ms, and preferably at least 50 ms.

Figure 2:
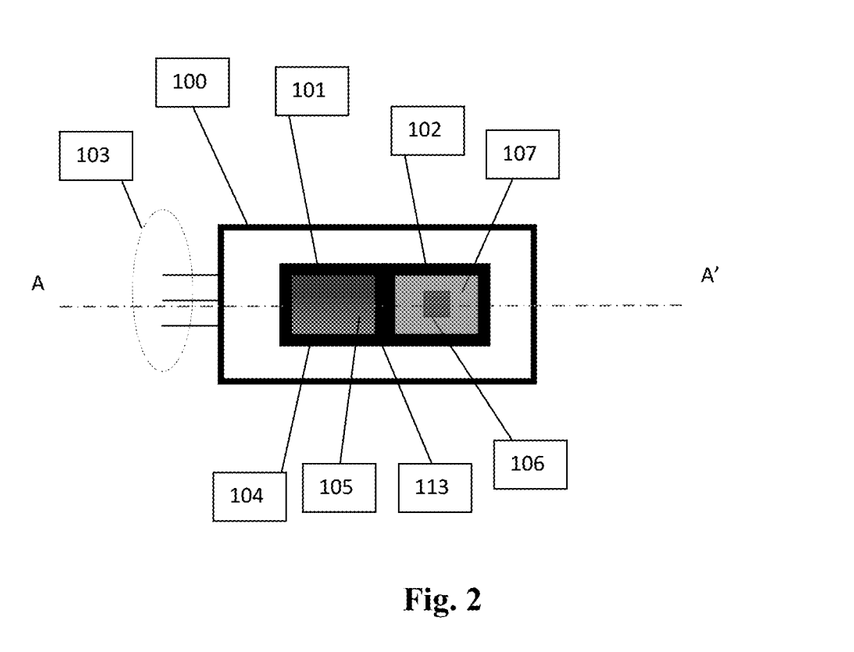
FIG. 2 Is a schematic view of an integrated LED structure according to an embodiment of the present invention.
Figure 3:
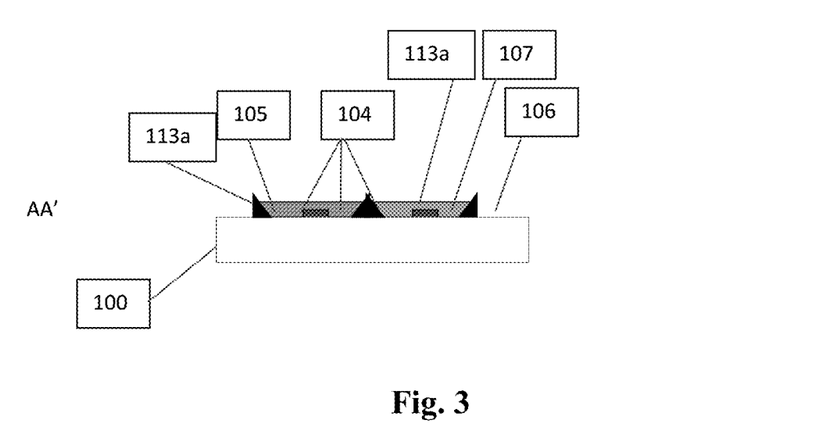
FIG. 3 Is a schematic view of the cross-section of an integrated LED structure according to an embodiment of the present invention.

Turning next to the embodiment shown in FIGS. 2 and 3 it can be noted that the LED structure of those drawings is comprised of a substrate 100, two non-interacting isolated emission areas 101, and 102, and a three wire control interface 103 (see FIG. 2). The first emission area 101 comprises a LED semiconductor chip 104 emitting at 425 nm, and a wavelength conversion material layer 105 having its peak emission at 630 nm and having a full width half maximum (FWHM) emission of about 50 nm. The second emission area 102 comprises a LED semiconductor chip 106 emitting at 450 nm, and a wavelength conversion material layer 107 having its peak emission at 660 nm and having a full width half maximum (FWHM) emission of about 50 nm.

The control interface is having a three-wire structure and is to enable independent control of the said two emission areas. One of the three electrical wires of the interface is electrically connected to the anode electrode of the emitter chip in the first emission area and is to provide the necessary electrical current to activate the said emitter. One of the three electrical wires of the interface is electrically connected to anode of the emitter chip in the second emission area and is to provide the necessary electrical current to activate the said emitter. One of the electrical wires of the interface is path connected to the cathode electrodes of the said emitters and is used as a common ground wire for the said two emitter chips.

The operation of the two emission areas is independent optically and electrically and is achieved by isolating the said first emission area from the second emission area with an optically opaque mesa structure 113, which prevents light emission from the emitter 104 located inside of the first emission area 101 to excite the wavelength conversion material layer 107 inside the said second emission area. The mesa structure 113a shadows the first emitter so that there is no direct light path from the first emission area to the adjacent emission area (FIG. 3).

Figure 4A:
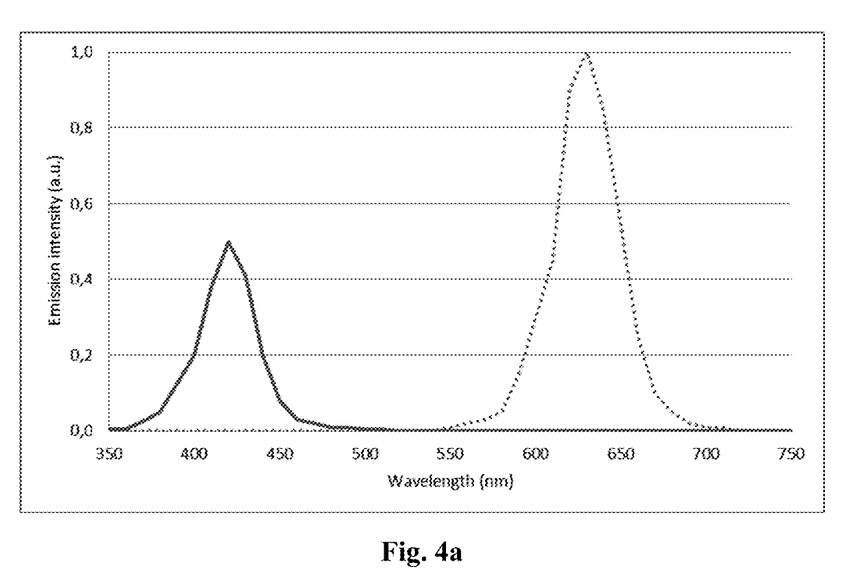
FIG. 4a Is a graph representing a typical partial spectrum of an integrated LED structure according to an embodiment of the present invention.
Figure 4B:
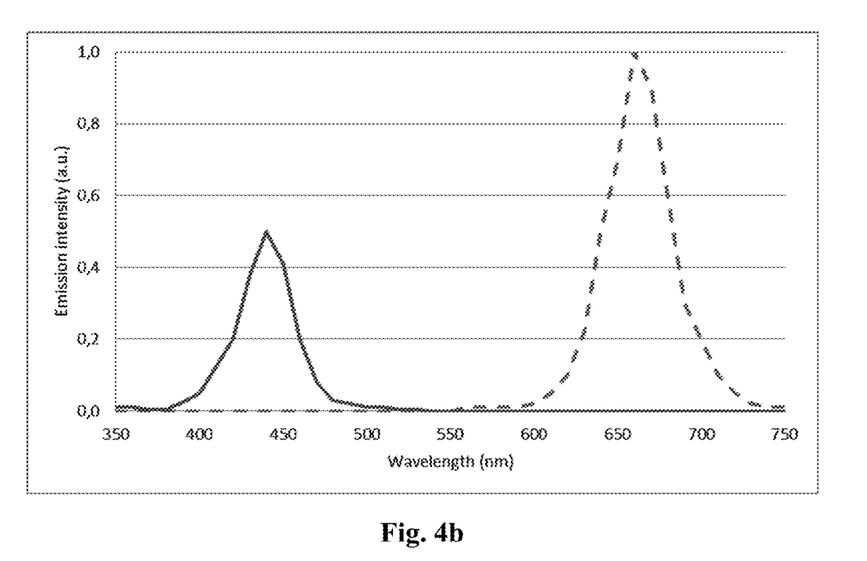
FIG. 4b Is a graph representing a typical partial spectrum of an integrated LED structure according to an embodiment of the present invention.

The first emission area and the second emission areas provide two red wavelength bands centered at 630 nm and 660 nm and provide emission for the quasi-continuous spectrum. Importantly the light emitters in the emission areas are driven independently and in this preferred case they are driven with equal length pulses and are not concurrently active. The emission centered at 630 nm is used for the excitation of the chlorophyll B molecule and the emission centered at 660 nm is used for the excitation of the chlorophyll A. The FIGS. 4a and 4b show the two alternating emission intensities as a function of wavelength.

The said first emission area and the second emission area are driven alternately with a pulsed current sequence with a pulse period being 0.1 ms. The pulse sequence of the two emission areas is synchronized so that chlorophyll A molecule is not excited by emission from 102 while chlorophyll B molecule is being excited by emission from 101. The pulse delay after chlorophyll B excitation by emission from area 101 is chosen to be equal to the non-radiating energy transfer time between the chlorophyll B and chlorophyll A.

Figure 5:
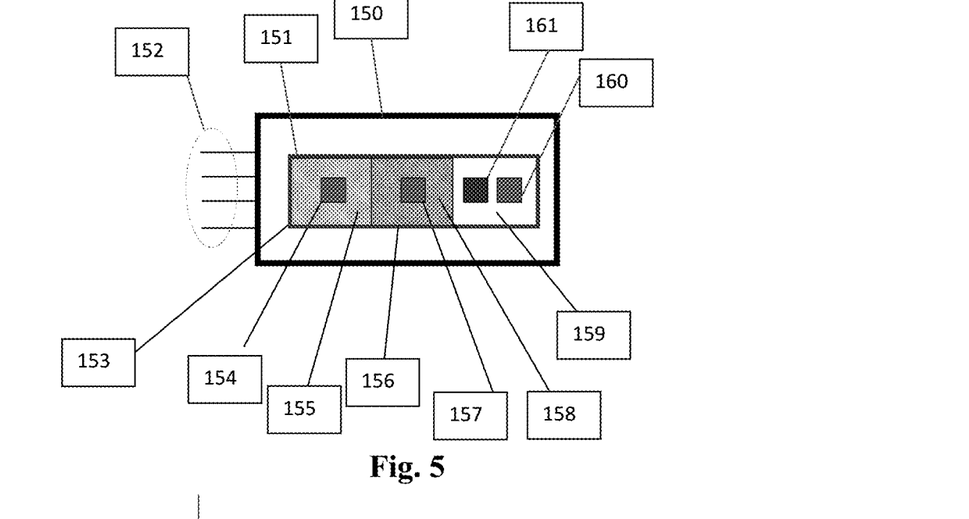
FIG. 5 Is a schematic view of an integrated LED structure with three isolated emission areas according to an embodiment of the present invention.

Turning next to FIG. 5, it will appear that the LED structure is comprised of a substrate (or a frame structure) 150, three isolated emission areas 151, and a four wire control interface 152 (FIG. 5). The first emission area 153 comprises a LED semiconductor chip 154 emitting at 438 nm to excite the wavelength conversion material layer 155 having its local maximum absorption near 438 nm and the peak emission at 630 nm and having a full width half maximum (FWHM) emission of about 50 nm. The second emission area 156 comprises a LED semiconductor chip emitting 157 at 425 nm to excite the wavelength conversion material layer 108 having its local maximum absorption near 425 nm and the peak emission at 660 nm and having a full width half maximum (FWHM) emission of about 50 nm. The third emission area 159 comprises LED semiconductor chips 160 and 161 emitting at 438 nm and 380 nm, each having a full width half maximum (FWHM) emission of about 20 nm. The control interface is having a four-wire structure and is to enable independent control of the said three emission areas.

The said first emission area and the second emission area are driven alternately with a pulsed current. The first emission area and the second emission areas provide the red wavelength bands for the quasi-continuous spectrum. The third emission area is driven with a pulsed current to provide blue and ultraviolet wavelength band for the quasi-continuous spectrum. The pulsed current sequence is provided through the 4-wire interface in a manner so that only one emission area out of three is at the time operating at maximum emission intensity. But always at least one emission area is active at least partially. While the light emission is being switched between two emission areas, the said two emission areas become active simultaneously but during this switching phase the emitting power of both emission areas is below maximum intensity level. Pulsed current is provided via the 4-wire interface and the average power loading is constant.

In the preferred case the quasi-continuous spectrum consists of a combined blue and ultra-violet band emission centered at 438 nm and 380 nm emitted (in the following also abbreviated "blue") from the third emission area, the first red band emission centered at 630 nm emitted (in the following also abbreviate "red1") from the first emission area, and the second red band emission centered at 660 nm (in the following also abbreviated "red2") emitted from the second emission area. The emission intensity varies at different wavelength bands and the ratio of intensities blue:red1:red2 is preferred to be for example 1:4:4.

In the pulsed mode operation the different emission areas are activated for different periods of time. In this case the blue and UV band emission is turned high for 80% of time, and the red band emissions are turned on for 10% of time, each. Thus the integrated LED structure is emitting light 100% of time but the emission wavelength is changing temporarily. With this approach the power supply is sourcing the circuitry 100% of time and has a constant power loading effect on the power supply side.

The LED chip circuits of the three emissions areas 101 are configured so that the drive conditions for the current and voltage are constant (or power) and a single constant current power supply circuit is able to drive all three emission areas 101 through the switch-circuitry 202 (cf. FIG. 6).

The control switches 203, 204, 205 are programmed directly from an external logic circuit or a computer interface. In principle only one of the control switches is active at a time to enable use of a single constant current power supply 201. However, due to the constant power loading requirement and the use of the capacitors banks, the light emission from each emission area has a finite rise and fall time in order of tens of microseconds. The control switches can be in closed state simultaneously to maintain the constant current draining of the power supply.

Figure 7:
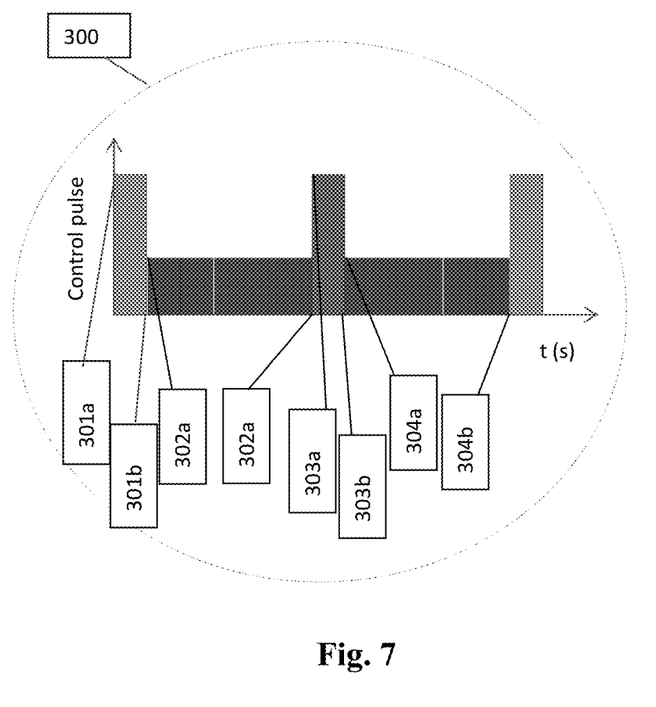
FIG. 7 Is a control scheme of an integrated LED structure according to an embodiment of the present invention FIG. 8 Is a graph representing of the light output sequence of different wavelength bands of an LED structure according to an embodiment of the present invention FIG. 9 Is a schematic view of quasi-continuous spectrum of an LED structure according to an embodiment of the present invention

In the typical driving scheme 300 the first control pulse is turned high 301a and the control switch 203 enables the drive current 210 through the light emitter circuit 207 in the first emission area 103 (FIG. 7).

Figure 8:
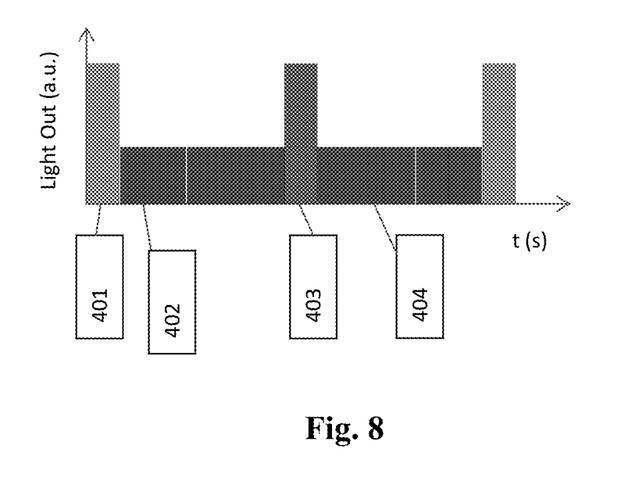

During this phase of the operation cycle the light emission centered at 630 nm 401 is turned on with a rise time below 0.02 ms (FIG. 8).

The finite rise time is due to the charging time of the capacitor 206. The rise and the fall times of the drive current 210 and thus the light emission 401 depend of the total parallel capacitance 206 with light emitters used in the circuitry 207. The duration of the current pulse is 0.1 ms and equals to time while the emission is active from the first emission area 103. After a period of 0.1 ms ($T_{red1}$) the control pulse is turned low 301b and the control switch 203 disables the drive current 210, and the LED chip circuit 207 in the first emission area 103 turns off with a fall time below 0.02 ms. The finite fall time is due to the discharging of the capacitor 206 through the light emitter circuit 207. After the fall time the light emission centered at 630 nm is now in practice turned off.

In parallel of decoupling the emitter circuit 207 with the switch 203 the control pulse is turned high 302a and the control switch 204 enables the drive current 211 run through the light emitter circuit 208 in the third emission area 109. Again the operation is similar with finite rise time due to the charging of the capacitor 214. It is important to note that the control pulse 301b and 302a overlap a fraction of time, say 0.01 ms, to maintain constant power loading condition.

During this phase of operation cycle the emission 402 with peak intensities at 438 nm and 380 nm is turned on. The subsequent control pulse maintains the third emission area active for a period of four (4) times the period of $T_{red1}$. Subsequently the control pulse is turned low 302b and the control switch 204 deactivates the third emission area 109, and the blue and UV emission 402 is now turned off after a fall time of about 0.02 ms.

Subsequently, the control pulse 303a enables the control switch 205 high to enable the current 212 run through the circuit 209 and thus activates the far red emission from the second emission area 106. Next, after a period of time $T_{red2}$, the control pulse is turned low 303b and the red emission 403 from the second emission area 106 is also turned off Subsequently after the disabling signal 303b of the control switch 205, the control pulse 304a is turned high and the control switch 204 enables the drive current 211 again run through the light emitter circuit 208 in the third emission area 109. During this phase of the operation cycle the emission 404 with peak intensities at 438 nm and 380 nm is turned on. The control pulse maintains the third emission area 109 active for a period of four times the period of $T_{red2}$. Subsequently the control pulse 304b is turned low and the control switch 204 deactivates the third emission area 109, and the blue and UV emission is now turned off after a fall time of about 0.02 ms.

Figure 9:
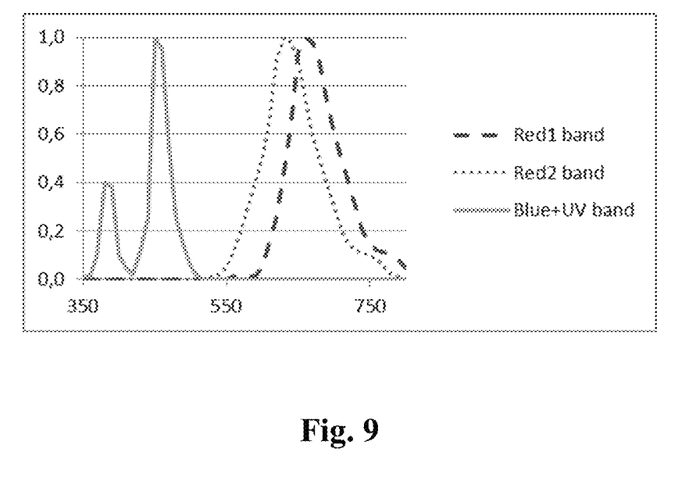

This completes one full cycle with three phases used to provide the required light quasi-continuous spectrum so that spectrum has blue, ultraviolet, and two red components in predetermined intensity ratios (FIG. 9). The cycle begins again by turning on the 630 nm emission from the first emission area, then combined emission of blue and UV, then 660 nm emission from the third emission area, and again combined emission of blue and UV, and so on. It is important to note that the control pulse pairs 301b and 302a, 302b and 303a, and 303b and 304a do not overlap in time to enable faster discharging of the capacitor. When the nurturing phase is seen to be complete the emission spectrum can now be adjusted to meet requirements for flowering phase. In this case this means adjusting the blue:630:660 ratios to 1:4:4 by appropriately programming the control pulse timing for 302, 303, 304.

The drive currents 210, 211, and 212 are physically linked with the control interface 102.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

INDUSTRIAL APPLICABILITY

The disclosed technology, the integrated LED structure, and the method of pulsed illumination are generally useful in the fields of agriculture, horticulture and biomass growing industry.

In particular, the integrated LED structure can find use in grow light systems previously presented in the art. The integrated LED structure perfectly suits grow light systems that apply various sensors for $CO_2$, soil humidity, canopy height, or growth phase to control the illumination by the feedback from the plants and require dynamic luminaires with adjustable spectrum, tunable intensity and controllable pulse mode operation.

REFERENCE SIGNS LIST

100; 150; 200 substrate
101, 102; 153, 156, 159 emission areas
103; 152 control interface
104, 106; 154, 157,
160, 161 semiconductor chip
105, 107; 155, 158 wavelength conversion material layer
113, 113a mesa structure
201 power supply
202 switch-circuitry
201a 203, 204, 205 control switches
206, 214 capacitor
207, 208, 209 light emitter circuit
210, 211, 212 drive current
300 driving scheme
301a, 302a high position of control pulse
301b low position of control pulse
303a, 304a control pulse
304b low position of control pulse
401, 402 light emission

CITATION LIST

Patent Literature

U.S. Pat. No. 5,012,609
U.S. Pat. No. 5,278,432
WO02067660
U.S. Pat. No. 8,410,725
U.S. Pat. No. 8,302,346

CN201797809
CN103947470
CN103947469
US20130139437
WO2014188303
US2014152194
U.S. Pat. No. 8,549,787
US2014034991
U.S. Pat. No. 7,350,933
WO2013141824

Non-Patent Literature

Vänninen, 2012, Renewable and Sustainable Energy Reviews 13 (2009) 2175-2180
Carvalho et al., 2014, Horticulture Research (2014) 1, 8
Lefsrud et al., 2008 HortScience 43:2243-2244
Beelmann et al., 2009, HAL Project# MU07018
Nicklish_1998_J. Plankton Res.-1998-Nicklisch-105-19
Eytan-1974-J. Biol. Chem.-738-44
Argyroudi-Akoyunoglou-1970_Plant_Physiology 247-9
Sforza et al., 2012, PLoS ONE 7(6): e38975
Olle et al., 2013, Agricultural and Food Science, 22:223-234
Klueter et al., 1980, Transactions of the ASABE. 23 (2): 0437-0442
Yeh, et al. 2009, Renewable and Sustainable Energy Reviews 13: 2175-2180
Tennessen et al., 1995, Photosynthesis Research 44: 261-269
Golbeck, 2004 "Photosystem I", Bioenergetics volume of Biophysics

The invention claimed is:

1. A LED structure comprising:
a substrate;
a plurality of optically independent light emission areas on substrate;
a light emitting semiconductor source of a first type mounted in part of the emission area(s);
a light emitting semiconductor source of a second type mounted in part of the emission area(s);
a wavelength conversion material of the first type formed on the top of the said first type of light emitting semiconductor sources; and
a wavelength conversion material of the second type formed on the top of the said second type of light emitting semiconductor sources
wherein:
at least one of the light emission areas has a dual layer structure formed of two wavelength conversion materials layered upon each other;
the upper wavelength conversion layer has excitation maximum between 415 and 435 nm and emission maximum between 620 and 640 nm and full width half maximum of 50 nm;
the lower wavelength conversion layer has excitation maximum between 430 and 450 nm and emission maximum between 650 and 670 nm and full width half maximum of 50 nm; and
the light emission area has a set of light emitting components between 415 and 435 nm and between 430 and 450 nm beneath the wavelength conversion material layers.

* * * * *